United States Patent [19]
Otaka

[11] Patent Number: 5,872,475
[45] Date of Patent: Feb. 16, 1999

[54] VARIABLE ATTENUATOR

[75] Inventor: Shoji Otaka, Yokohama, Japan

[73] Assignee: Kabushiki Kaisha Toshiba, Kawasaki, Japan

[21] Appl. No.: 828,352

[22] Filed: Mar. 28, 1997

[30] Foreign Application Priority Data

Mar. 29, 1996 [JP] Japan .................................. 8-076247
Oct. 18, 1996 [JP] Japan .................................. 8-276423

[51] Int. Cl.⁶ .............................. H03G 3/00; H03K 5/08
[52] U.S. Cl. ...................... 327/308; 327/306; 327/407; 327/563; 333/81 R; 330/283
[58] Field of Search .................................. 327/306, 308, 327/405, 404, 411, 407, 403, 408, 563, 99; 333/81 R; 330/144, 283, 284

[56] References Cited

U.S. PATENT DOCUMENTS 5,298,810   3/1994   Scott et al. .............................. 327/407

FOREIGN PATENT DOCUMENTS 7-154182   6/1995   Japan .

OTHER PUBLICATIONS

IEEE Journal of Solid–State Circuits, vol. 30, No. 12, pp. 1421–1429, Dec. 1995, Trudy D. Stetzler, et al., "A 2.7–4.5 V Single Chip GSM Transceiver RF Integrated Circuit".

*Primary Examiner*—Dinh Le
*Attorney, Agent, or Firm*—Oblon, Spivak, McClelland, Maier & Neustadt, P.C.

[57] ABSTRACT

A variable attenuator is provided with a plurality of amplifiers each comprising an emitter grounded or common source amplifier circuit. The amplifiers have different emitter degeneration impedances. One of the amplifiers is selected in accordance with a gain control signal under control of a current switch controller. The selected amplifier is connected to a current source and supplied with an operating current, and thus the selected amplifier is set in an operating state. The other amplifiers are not supplied with an operating current and thus do not operate. The gain of the variable attenuator is determined by a ratio between the emitter degeneration impedance of the selected amplifier and a load impedance.

13 Claims, 6 Drawing Sheets

VARIABLE ATTENUATOR

BACKGROUND OF THE INVENTION

The present invention relates generally to a variable attenuator having a gain set variably by a gain control circuit, and more particularly to a variable attenuator suitable for use in a radio device such as a mobile radio transceiver.

With recent development of personal use of information, there is an increasing demand for radio devices such as mobile handy-phone equipment and cellular phones. With an increase in the number of subscribers of mobile handy-phone equipment, etc., the frequencies handled by radio devices become higher in order to provide a greater number of radio channels. For example, in the PHS (Personal Handy-phone System) in Japan, 1.9 GHz is used as a carrier frequency. On the other hand, with developments of high-speed circuit techniques and mounting techniques, radio terminals capable of handling high-speed signals has been reduced in size.

However, a mobile radio terminal needs to be battery-powered. In order to reduce power consumption in the radio terminal, the control of transmission power must be controlled with high precision. A higher level of techniques has been required to achieve high-precision control of transmission power.

In the context of this description, a variable attenuator is used as an element for controlling a transmission power of, for example, the mobile radio transceiver as mentioned above. A high-precision gain control has been desired to reduce power consumption of the mobile radio transceiver.

In a general radio terminal, a baseband signal such as a voice signal, which has been processed by a baseband signal generator, is supplied to a modulator. In the modulator, a first local signal f1 from a first local signal oscillator is modulated on the basis of the baseband signal. In an up converter, provided in a subsequent stage, the modulated signal is subjected to a frequency conversion to obtain an RF signal on the basis of a frequency signal f2 from a second local signal oscillator. The RF signal is gain-controlled by a variable attenuator and then amplified to a predetermined transmission level by a power amplifier (PA). The amplified signal is output from an antenna as electric wave.

The variable attenuator is designed to set a transmission power at a desired value. The transmission power can be optimized by the high-precision gain control carried out by the variable attenuator. Thus, the high-precision gain control contributes to reducing power consumption of a transmission unit, and accordingly, the radio transceiver itself. In particular, a variable attenuator capable of performing high-precision gain control plays an important role in battery-powered mobile radio devices.

In the prior art, such a variable attenuator generally comprises π-type or T-type ladder resistors and GaAs MESFETs for switching for separating/short-circuiting those resistors. In general, however, GaAs MESFET techniques are unsuitable for mobile terminals, which need to be reduced in power consumption and cost, since the price of wafers for GaAs MESFETs is about ten times higher than that of silicon wafers.

The same function as with the above-described variable attenuator can be achieved by a circuit using less expensive silicon bipolar transistors. In this circuit, input signals are supplied as differential voltage signals Vin+ and Vin−. These input signals are converted to a differential current signal by a differential amplifier. In consideration of a transistor constituting a power supply, this circuit can be constructed by cascade-connected three-stage transistors, thus permitting low-voltage operation. However, since the gain is a function of differential control signals Vcon+ and Vcon−, high-precision gain control cannot be achieved unless precise analog signals are provided to the signals Vcon+ and Vcon−.

As has been described above, in the conventional variable attenuator using bipolar transistors, the gain is determined by the function of analog control signals, and thus high-precision gain control is difficult to achieve.

BRIEF SUMMARY OF THE INVENTION

The object of the present invention is to provide a variable attenuator capable of performing gain control in a digital manner, and not in an analog manner, with high precision at low cost.

According to the invention, there is provided a variable attenuator comprising a plurality of amplifiers having different emitter degeneration resistances, a single current source, and a single load commonly connected to the amplifiers, one of the amplifiers being connected to the single current source via a current switch controlled by a digital signal.

Specifically, according to the invention, there is provided a variable attenuator comprising a plurality of amplifiers having different emitter degeneration impedances; a load commonly connected to the amplifiers; a current source; and a current switch circuit, connected between the current source and the amplifiers, for selecting one of the amplifiers in accordance with a gain control signal, connecting the selected amplifier to the current source and supplying a current from the current source to the selected amplifier as an operating current, the gain of the variable attenuator being determined by the emitter degeneration impedance of the selected amplifier and the load impedance of the load.

The variable attenuator is provided with a plurality of amplifiers each comprising, for example, an emitter grounded or common source amplifier circuit. The emitter degeneration impedances of the amplifiers are set at different values. The emitter degeneration impedance functions as a negative feedback impedance of an common emitter circuit or a common source circuit and reduces the gain of the amplifier circuit. One of the amplifiers is selected in accordance with a gain control signal under control of the current switch circuit. The selected amplifier is connected to a current source and supplied with an operating current, and thus the selected amplifier is set in an operating state. The other amplifiers are not supplied with an operating current and thus do not operate. The gain of the variable attenuator is determined by a ratio between the emitter degeneration impedance of the selected amplifier and a load impedance. Since the gain control signal is used only to select the amplifier, it does not relate to the determination of the gain. Since the amplifiers have different emitter degeneration impedances, the gain of the variable attenuator can be varied by changing the amplifier to be selected.

The circuit structure adopted in this invention can be achieved by an common emitter circuit or a common source circuit using inexpensive transistors. In addition, one of the amplifier circuits is selected in a digital-type switching operation. Thus, gain control can be precisely performed in multiple stages corresponding to the number of amplifier circuits.

Each amplifier circuit may comprise an emitter grounded type amplifier circuit using a bipolar transistor or a source grounded type amplifier circuit using a MOS transistor. In this case, an emitter of the bipolar transistor or a source of the MOS transistor is connected to an impedance circuit for determining the value of the emitter degeneration impedance. Accordingly, a plurality of amplifiers having different emitter degeneration impedances can be obtained only by using impedance circuits with different resistance values for the respective amplifiers.

In this case, it is preferable to constitute the impedance circuit by a series circuit of a resistor and a capacitor. With this structure, the capacitor can prevent incoming of operating current from the ground terminal via the impedance circuit. Thus, only the amplifier having the emitter of the bipolar transistor or the source of the MOS transistor connected to the current source can be operated.

Each of the amplifiers may comprise one of an emitter coupled differential amplifier circuit using a pair of bipolar transistors or a source coupled type differential amplifier circuit using a pair of MOS transistors. In this case, too, an impedance circuit for determining the value of the emitter degeneration impedance may be connected to the emitters of the bipolar transistors of the emitter coupled differential amplifier circuit or the sources of the MOS transistors of the source coupled type differential amplifier circuit.

In the case where the above-mentioned differential amplifier circuits are used as amplifiers and the entire circuit is constructed as a differential circuit, it is desirable to provide a pair of loads commonly connected to a plurality of pairs of transistors of the differential amplifiers, and a pair of current sources, and to connect a pair of transistors of a selected one of the differential amplifiers to the pair of current sources. Thereby, differential signals can be input and output.

A variable attenuator with a wider gain control range can be obtained by cascade-connecting a plurality of variable attenuator circuits each comprising a plurality of amplifiers having different emitter degeneration impedances, a current source, a load commonly connected to the amplifier, and a current switch circuit for connecting one of the amplifiers to the single current source.

In this case, it is desirable that the output of the variable attenuator of the previous stage be directly connected to the input of the variable attenuator of the subsequent stage. Assuming an emitter follower circuit or a source follower circuit is provided as a buffer circuit between the variable attenuators and the current flowing through the variable attenuator is constant. In such a case, a current flowing in the transistors of the amplifier becomes smaller than a predetermined value by an amount corresponding to a current flowing in the emitter follower circuit or source follower circuit. Consequently, linearity of input/output characteristics of the amplifier circuit is degraded.

The current switch circuit used in the present invention may be constituted by a digital switch control circuit. The digital switch control circuit includes a plurality transistors connected at one end commonly to a current source and at the other end to a plurality of amplifiers, and one of the transistors is selected by a digital control signal, thereby causing a current from the current source to totally flow through the selected transistor to the amplifier connected to the selected transistor.

In this case, it is desirable that the number of transistors constituting the current switch circuit be less than that of transistors constituting the current source, since the parasitic capacity of the current switch circuit increases as increasing the number of transistors constructing the current switch circuit increases, resulting in affecting the amplifier connected to the current switch circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will now be described with reference to the accompanying drawings.

Figure 1:
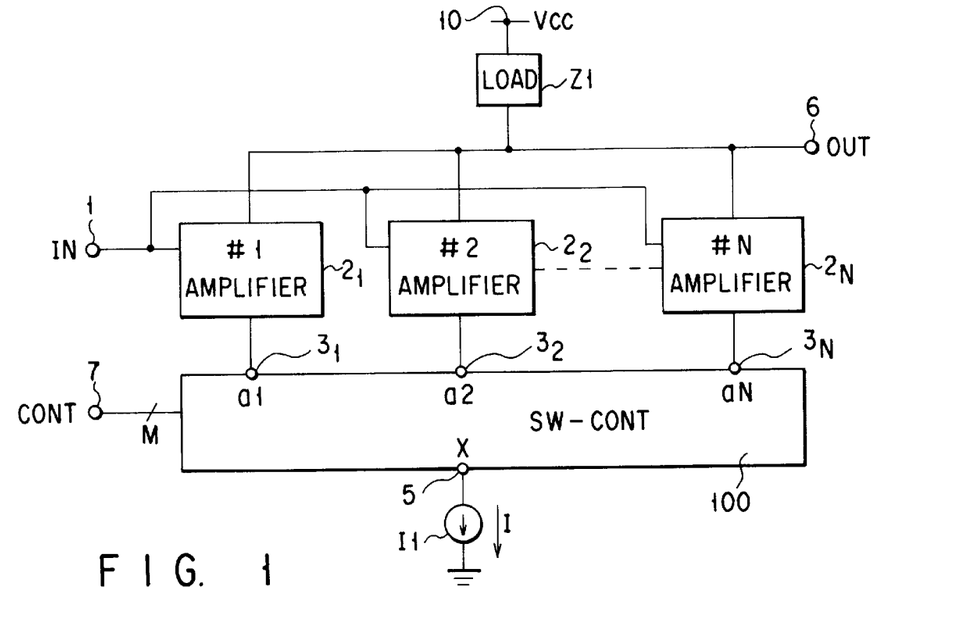
FIG. 1 is a block diagram showing a variable attenuator according to a first embodiment of the present invention.

FIG. 1 shows a basic structure of a variable attenuator according to a first embodiment of the present invention. This variable attenuator is a power gain control element for use in a device, such as a mobile radio device, wherein a high-frequency signal is used as an input signal and low power consumption is required. This variable attenuator is fabricated in the form of an integrated circuit (IC).

In FIG. 1, an N-number of amplifiers, i.e. #1 to #N amplifiers $2_1, 2_2 \ldots 2_N$, have different emitter degeneration impedances. Each of the #1 to #N amplifiers comprises an emitter-grounded circuit or a source-grounded circuit having an emitter negative feedback resistor or a source negative feedback resistor.

As is shown in FIG. 1, a signal input terminal of each of the #1 to #N amplifiers $2_1, 2_2 \ldots 2_N$ is connected to a signal input terminal 1 of the variable attenuator to which an RF input signal IN to be gain-controlled is input. Collector-side or drain-side current output terminals of the #1 to #N amplifiers are commonly connected to one terminal of a load Z1. The other terminal of the load Z1 is connected to a power supply VCC terminal 10. The connection node between the load Z1 and the amplifiers $2_1, 2_2 \ldots 2_N$ is connected to a signal output terminal 6 of the variable attenuator. The input signal IN, which has been attenuated by the variable attenuator, is output as output signal OUT from the signal output terminal 6.

Emitter-side or source-side ground terminals $3_1, 3_2 \ldots 3_N$ of the #1 to #N amplifiers are connected to output terminals $a_1, a_2 \ldots a_N$ of a current switch controller (SW-CONT) 100.

The current switch controller (SW-CONT) 100 is a digitally controlled current switch for selecting one of the #1 to #N amplifiers in accordance with an M-bit digital gain control signal CONT which is input to a control signal input terminal 7, and connecting the selected amplifier to a current source I1. A current I input from the current source I1 to a terminal 5 is supplied to only one of the output terminals $a_1$, $a_2 \ldots a_N$ selected by the digital gain control signal CONT.

It should suffice if M meets the condition, M≧log2 (N). One of the #1 to #N amplifiers is selected in accordance with the digital gain control signal CONT, and the current I from the current source I1 is supplied to the selected amplifier as an operating current.

Since the selected amplifier is supplied with the current I as the operating current from the current source I1 via the current switch control circuit (SW-CONT) 100, as described above, the selected amplifier is set in an operating mode. The non-selected amplifiers are not operated and do not basically relate to the operation of the variable attenuator. The non-selected amplifiers, however, function as a capacitive load on the selected amplifier. In the actual design of the attenuator, therefore, it is preferable to consider the capacitive load. It is desirable that the current source I1 be a constant current source. In this case, the current source I1 can be constructed by, e.g. a current-mirror type circuit. The current source I1 may be constructed by an ordinary resistor.

The gain or attenuation amount of the selected amplifier is determined by a ratio between the emitter degeneration impedance and the impedance of load Z1 thereof. The amplifiers have different values of emitter degeneration impedance and one of the amplifiers is selected by the gain control signal CONT. Thus, the gain or attenuation amount of the selected amplifier is determined by the gain control signal CONT.

Examples of the structures of each of #1 to #N amplifiers and current switch control circuit 100, as shown in FIG. 1, will now be described.

Figure 2A:
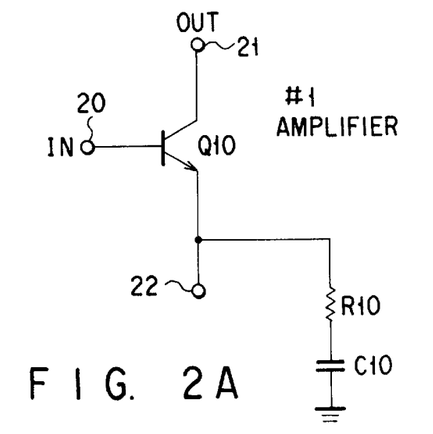
FIG. 2A is a circuit diagram of a bipolar transistor amplifier used in the variable attenuator according to the first embodiment.

FIG. 2A shows an example of each amplifier.

This amplifier is an emitter grounded amplifier using one NPN bipolar transistor Q10. A base terminal 20 of the NPN bipolar transistor Q10 is connected to the input terminal 1 shown in FIG. 1. An emitter terminal 22 corresponds to a terminal $3_1$, $3_2$ or $3_3$ in FIG. 1. If the amplifier is the #1 amplifier, the emitter terminal 22 is connected to the output terminal a1 of the current switch control circuit 100. A collector terminal 21 corresponds to the terminal 6 in FIG. 1.

The emitter terminal 22 of transistor Q10 is also connected to one end terminal of a series circuit of a resistor R10 and a capacitor C10. The other end terminal of the series circuit is connected to a ground or an imaginary ground terminal. The voltage across both end terminals of the series circuit is proportional to the output current of the amplifier circuit and functions to cancel the input signal supplied to the base. Thus, a negative feedback is performed. Accordingly, the series circuit functions as an emitter degeneration impedance.

The gain G of the amplifier circuit can be approximated by the equation:

$$G = -Z1/Z2$$

where Z1 is the impedance value of load impedance Z1, and Z2 is the impedance value of the series circuit of resistor R10 and capacitor C10. Supposing that the impedance Z1 is resistance RZ1 and the impedance Z2 is approximated to the value of resistor R10 at operating frequency, the gain can be approximated by $$G = -RZ1/R10.$$

Accordingly, the gain can be determined by the resistance ratio alone. Thus, the gain of each amplifier can be determined only by setting the value of R10 in each amplifier at a predetermined value.

Since the capacitor C10 is provided in the series circuit of each amplifier, the operating current is prevented from coming in via the series circuit. Thus, only the amplifier selected by the current switch control circuit 100 can be operated.

Figure 2B:
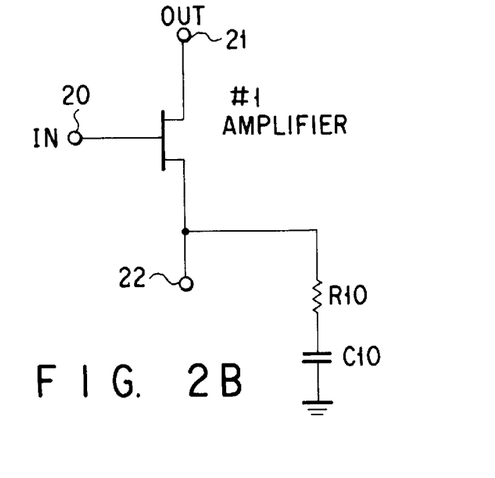
FIG. 2B is a circuit diagram of a MOS transistor amplifier used in the variable attenuator according to the first embodiment.

FIG. 2B shows an amplifier comprising a MOS transistor. This amplifier has the same function as the amplifier shown in FIG. 2A.

Figure 3:
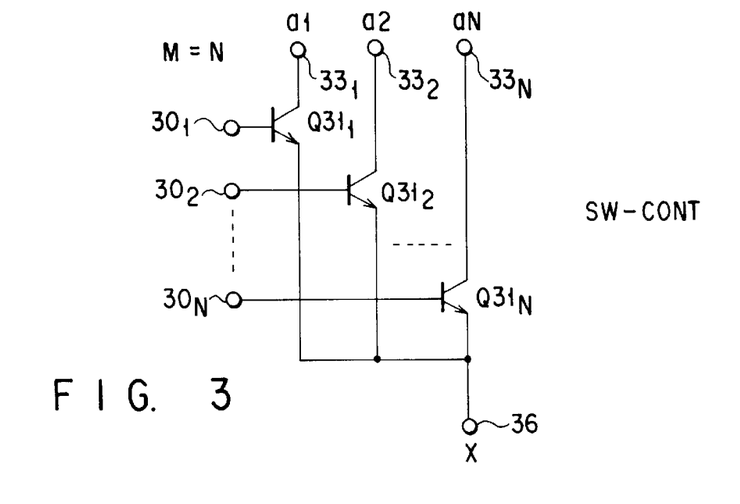
FIG. 3 is a circuit diagram of a current switch control circuit used in the variable attenuator according to the first embodiment.

FIG. 3 shows an example of the current switch control circuit 100.

In the circuit configuration shown in FIG. 3, M=N. The circuit 100 comprises an N-number of transistors $Q31_1$, $Q31_2 \ldots Q31_N$. Terminals $30_1, 30_2 \ldots 30_N$ are connected to the bases of transistors $Q31_1, Q31_2 \ldots Q31_N$. Terminals $33_1, 33_2 \ldots 33_N$ are the collector terminals of transistors $Q31_1, Q31_2 \ldots Q31_N$. The emitters of transistors $Q31_1$, $Q31_2 \ldots Q31_N$ are commonly connected to a terminal 36. The terminal 36 corresponds to the terminal 5 in FIG. 1, and the terminals $33_1, 33_2 \ldots 33_N$ correspond to the terminals $3_1, 3_2 \ldots 3_N$ in FIG. 1.

The specific operation of the current switch controller will now be described, supposing that the gain control signal CONT has been generated to supply the current I from the current source I1 to the terminal $33_1$.

For example, a potential of about 3·VT=75 mV or above is applied to the terminal $30_1$, as compared to the other terminals $30_2 \ldots 30_N$. Because of the characteristics of the bipolar transistor, most of the current I input to the terminal 36 is caused to flow to the transistor $Q31_1$. Symbol VT denotes a thermal voltage of the bipolar transistor.

Accordingly, most of the current I shown in FIG. 1 flows to the terminal $33_1$ via the current switch controller. Specifically, the current switch controller 100 operates to let the current I flow to the terminal $3_1$ in FIG. 1.

As has been described above, in the variable attenuator according to the first embodiment, the amplifiers $2_1, 2_2 \ldots 2N$ constituted by emitter grounded amplifier circuits have different emitter degeneration impedances. One of the amplifiers $2_1, 2_2 \ldots 2_N$ is selected by the digitally controlled current switch controller 100 in accordance with the gain control signal CONT. The selected amplifier is connected to the current source I1 and supplied with an operating current, and the selected amplifier is set in the operating state. The other amplifiers are not supplied with the operating current and thus are not operated. In this case, the gain of the variable attenuator is determined by the ratio between the emitter degeneration resistance of the selected amplifier and the load Z1. By changing the selected amplifier in accordance with a desired gain, the gain of the variable attenuator can be varied precisely.

Each amplifier may be constructed by a common source circuit using a MOS transistor, as shown in FIG. 2B. The emitter degeneration resistance is provided by connecting the above-described C-R series circuit between the source and the ground. Moreover, each amplifier may be constructed by an emitter connection type differential amplifier circuit using a pair of bipolar transistors, or a source connection type differential amplifier circuit using a pair of MOS transistors. In this case, an impedance circuit for determining the emitter degeneration impedance, such as the C-R series circuit, may be connected to the emitters of the bipolar transistors constituting the emitter connection type differential amplifier circuit or the sources of the MOS transistors constituting the source connection type differential amplifier circuit.

A second embodiment of the present invention will now be described.

Figure 4:
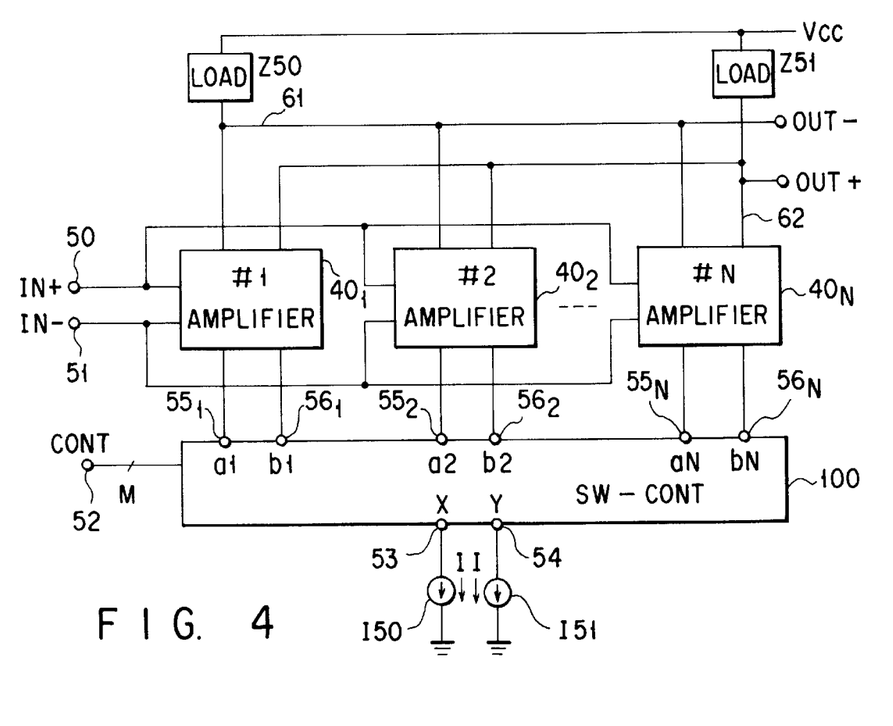
FIG. 4 is a block diagram showing a variable attenuator according to a second embodiment of the present invention.

FIG. 4 shows a basic structure of a variable attenuator according to the second embodiment of the invention. Like the first embodiment, this attenuator is constructed such that a plurality of amplifiers having different emitter regeneration impedances are selectively operated by a current switch controller. In this attenuator, however, differential signals are input and output.

In FIG. 4, input terminals 50 and 51 receive differential RF input signals IN+ and IN−. The input terminals 50 and 51 are connected to differential input terminals of #1 to #N differential amplifiers $40_1, 40_2 \ldots 40N$ having different emitter degeneration resistances. The #1 to #N differential amplifiers produce current outputs as differential outputs and each of the #1 to #N amplifiers has two output terminals.

The differential output terminals of the respective differential amplifiers are commonly connected, as shown in FIG. 4, and connected to a power supply VCC terminal via load impedances Z50 and Z51. On the other hand, a current switch controller (SW-CONT) 100 receives currents I from two current sources I50 and I51 and also receives an M-bit gain control signal CONT. Output terminals a1, b1, a2, b2,...aN, bN of the current switch controller 100 are connected to the #1 to #N differential amplifiers.

In accordance with the M-bit gain control signal CONT input to a control signal input terminal 52, the current switch controller 100 selects one of the pairs of output terminals a1, b1 to aN, bN and supplies the currents I from the power supplies I50 and I51 to the selected pair of output terminals. In this case, it should suffice if the value $M \geq \log 2 (N)$.

Operating currents are supplied to the selected differential amplifier to set this amplifier in the operating mode. The non-selected differential amplifiers do not basically relate to the operation of the variable attenuator. The non-selected differential amplifiers, however, function as a capacitive load on the selected differential amplifier. In the actual design of the amplifiers, therefore, it is necessary to consider the capacitive load. The gain of the selected differential amplifier is associated with the gain control signal CONT. Thus, output signals of predetermined amplitudes appear at the output terminals OUT+ and OUT−.

Examples of the structures of each of #1 to #N differential amplifiers and current switch control circuit 100 will now be described.

Figure 5A:
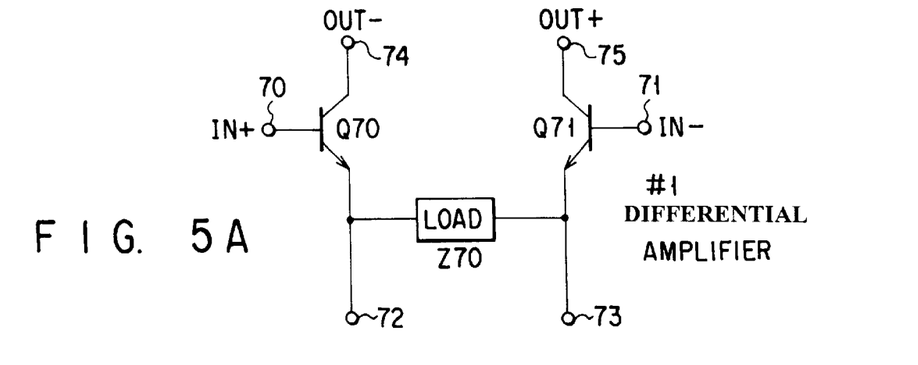
FIG. 5A is a circuit diagram of a bipolar transistor differential amplifier used in the variable attenuator according to the second embodiment.

FIG. 5A shows an example of a bipolar transistor differential amplifier.

This differential amplifier is an emitter coupled differential amplifier in which the emitters of a pair of NPN bipolar transistors Q70 and Q71 are coupled. Base terminals 70 and 71 are connected to the input terminals 50 and 51 shown in FIG. 4. Emitter terminals 72 and 73 correspond to terminals $55_1, 56_1$, terminals $55_2, 56_2$, or terminals $55_N, 56_N$. If the differential amplifier is the #1 amplifier, the emitter terminals 72 and 73 are connected to the output terminals a1 and b1 of the current switch controller 100.

Collector terminals 74 and 75 correspond to the terminals 61 and 62 in FIG. 4. An impedance Z70 is connected as an emitter degeneration impedance between the emitters of transistors Q70 and Q71. In this case, a gain G is approximated by $$G = -Z50/Z70 \times 2$$

where Z50 is the value of each of the load impedances Z50 and Z51, and Z70 is the value of the impedance Z70. Supposing that the load impedance Z50, Z51 has resistance value R50 and the impedance Z70 has resistance value R70, the gain is approximated by $$G = -R50/R70 \times 2$$

Figure 7A:
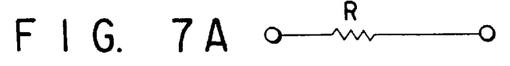
FIGS. 7A and 7B are circuit diagrams of load circuits used in the variable attenuator according to the second embodiment.
Figure 7B:
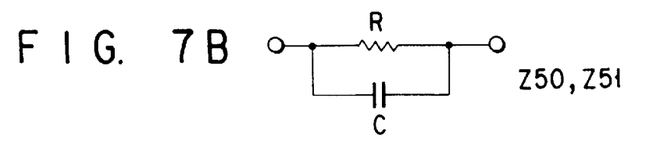

Accordingly, the gain can be determined by the resistance ratio. Thus, the gain of each differential amplifier can easily be determined by setting the resistance value R70 at a desired value in each differential amplifier. Although the construction becomes slightly complex, the impedance Z70 may be constituted, as shown in FIGS. 6A to 6F, by a resistor, a capacitor, a series circuit of a resistor and a capacitor, or a parallel circuit of a resistor and a resistor. Similarly, each of the load impedances Z50 and Z51 may be constructed by a resistor R or a parallel circuit of a resistor R and a capacitor C, as shown in FIGS. 7A and 7B.

The impedance Z70 can be constructed without using a capacitor, since the impedance Z70 is connected between the emitters and not connected to the ground terminals. Even if incoming of current from the ground terminals is not prevented by a capacitor, only the differential amplifier selected by the current switch controller 100 can be operated.

Figure 5B:
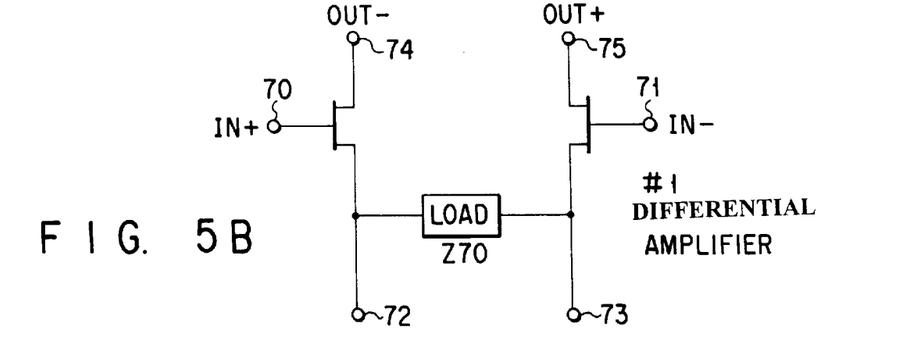
FIG. 5B is a circuit diagram of a MOS transistor differential amplifier used in the variable attenuator according to the second embodiment.
Figure 6A:
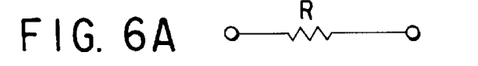
FIGS. 6A to 6F are circuit diagrams showing various emitter degeneration impedance circuits used in the variable attenuator according to the second embodiment.
Figure 6B:
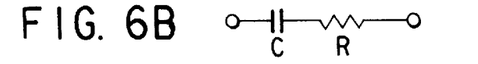
Figure 6C:
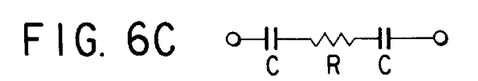
Figure 6D:
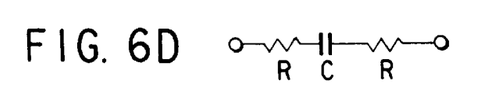
Figure 6E:
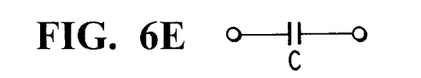
Figure 6F:
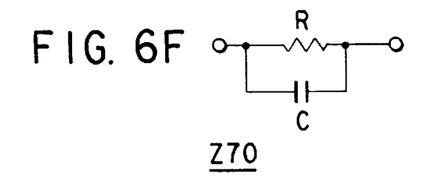

FIG. 5B shows a differential amplifier using MOS transistors. This amplifier has the same function as that shown in FIG. 5A.

Figure 8A:
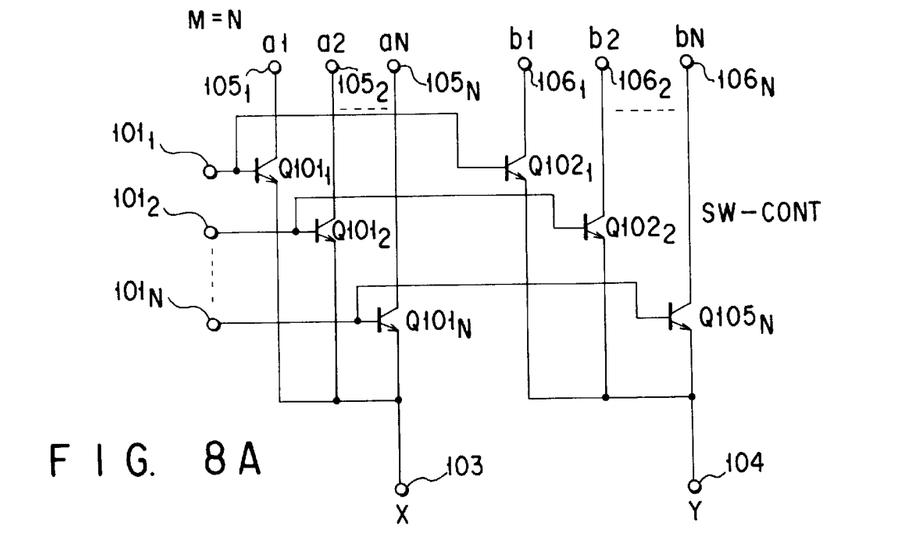
FIG. 8A is a circuit diagram of a current switch control circuit used in the variable attenuator according to the second embodiment.

FIG. 8A shows an example of the structure of the current switch controller 100 in the case where M=N.

The current switch controller 100 comprises an N-number of pairs of NPN bipolar transistors. Terminals $101_1, 101_2 \ldots 101_N$, as shown in FIG. 8A, are connected to the bases of different pairs of transistors $Q101_1, Q102_1, Q101_2, Q102_2 \ldots Q101_N, Q102_N$. Terminals $105_1, 105_2 \ldots 105_N$ and $106_1, 106_2 \ldots 106_N$ serve as collector terminals of the transistors $Q101_1, Q102_1, Q101_2, Q102_2 \ldots Q101_N, Q102_N$. The emitters of the transistors $Q101_1$, $Q101_2$ ... $Q101_N$ are commonly connected to a terminal 103, and the emitters of the transistors $Q102_1$, $Q102_2$ ... $Q102_N$ are commonly connected to a terminal 104. The terminals 103 and 104 correspond to the terminals 53 and 54 shown in FIG. 4. The terminals $105_1$, $105_2$ ... $105_N$ correspond to the terminals $55_1$, $55_2$ ... $55_N$. The terminals and $106_1$, $106_2$ ... $106_N$ correspond to the terminals $56_1$, $56_2$ ... $56_N$.

The operation of the current switch controller will now be described, supposing that the gain control signal CONT has been generated to supply the currents I from current sources I50 and I51 to the terminals $105_1$ and $106_1$.

For example, a potential of about 3·VT=75 mV or above is applied to the terminal $101_1$, as compared to the other terminals $101_2$ ... $101_N$. Because of the characteristics of the bipolar transistor, most of the currents I input to the terminals 103 and 104 is caused to flow to the transistors $Q101_1$ and $Q102_1$. Accordingly, most of currents I shown in FIG. 4 is supplied to the terminals $105_1$ and $106_1$. Specifically, the current switch controller 100 operates to supply the currents I to the terminals $55_1$ and $56_1$ shown in FIG. 4.

Figure 8B:
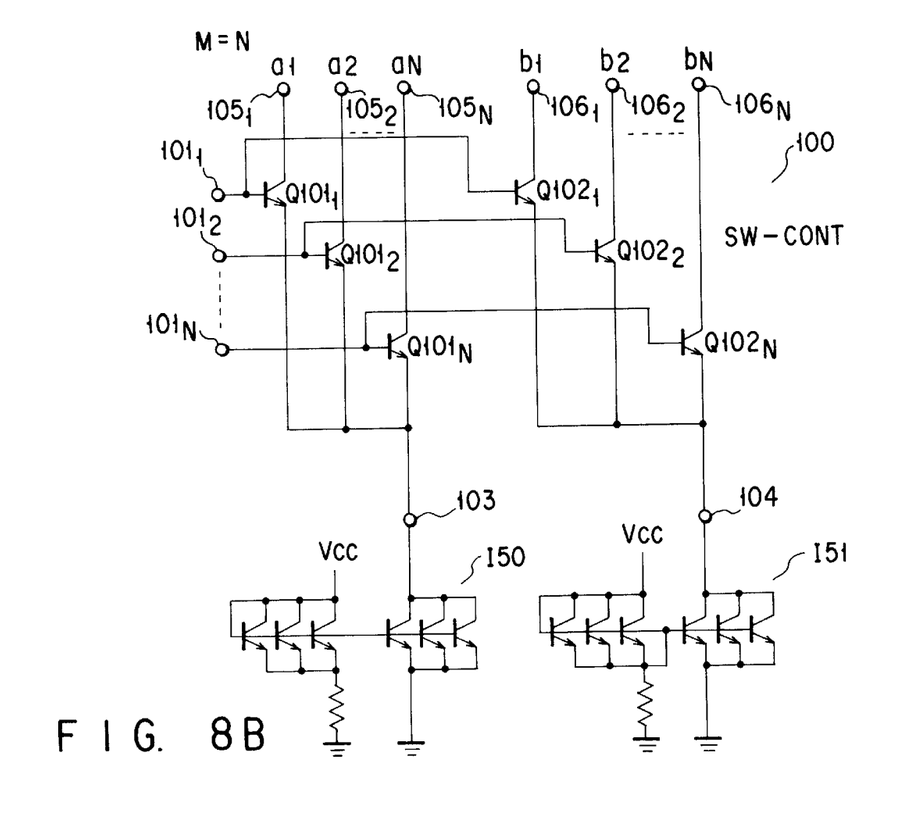
FIG. 8B is a circuit diagram showing current switch control circuit and constant current sources constructed by bipolar transistors.

It is preferable that the dimensions, for example, the collector area, of each of the NPN transistors $Q101_1$, $Q102_1$, $Q101_2$, $Q102_2$ ... $Q101_N$, $Q102_N$, which constitute the current switch controller 100, be made less than those of each of NPN bipolar transistors used in current-mirror circuits constituting the current sources I50 and I51 shown in FIG. 4. Alternatively, it is preferable, as shown in FIG. 8B, that the number of parallel-connected transistor elements constituting each of the NPN transistors $Q101_1$, $Q102_1$, $Q101_2$, $Q102_2$ ... $Q101_N$, $Q102_N$, which constitute the current switch controller 100, be made less than the number of parallel-connected transistor elements constituting each of NPN bipolar transistors used in current-mirror circuits constituting the current sources I50 and I51. For example, the NPN bipolar transistor of the current switch controller comprises one transistor element, and the NPN bipolar transistor of the current source comprises a plurality of parallel-connected transistors. Thereby, the value of parasitic impedance connected in parallel to the impedance Z70, which is connected between the emitters of the differential transistor pair constituting the selected differential amplifier, is reduced to suppress a variation in gain due to the parasitic impedance.

For example, suppose that the #1 amplifier is selected by letting the currents I from the current sources I50 and I51 flow to the terminals $105_1$ and $106_1$ shown in FIG. 8A. At this time, the collectors of the transistors $Q101_1$ and $Q102_1$ shown in FIG. 8A are connected to the emitters of the transistors Q70 and Q71, shown in FIG. 5A and 5B, which constitute the #1 differential amplifier. In this case, a parasitic capacitance Ccs being present between the collector of the transistor $Q101_1$ and the substrate is connected to the connection node between the collector of the transistor $Q101_1$ and the emitter of the transistor Q70. In addition, a parasitic capacitance Ccs being present between the collector of the transistor $Q102_1$ and the substrate is connected to the connection node between the collector of the transistor $Q102_1$ and the emitter of the transistor Q71. Since these parasitic capacitances Ccs are interconnected via the substrate resistance, a parasitic impedance is connected between the emitters of the transistors Q70 and Q71 shown in FIG. 5, in parallel to the emitter degeneration impedance Z70. The parasitic impedance is a factor which may change the gain of the differential amplifier to a value different from a set value.

If the collector area of each of the NPN bipolar transistors $Q101_1$, $Q102_1$, $Q101_2$, $Q102_2$ ... $Q101_N$, $Q102_N$ constituting the current switch controller 100 is reduced, the parasitic capacitances Ccs can be reduced and the gain variation due to the above-mentioned parasitic impedance can be suppressed. Since each of the NPN bipolar transistors $Q101_1$, $Q102_1$, $Q101_2$, $Q102_2$ ... $Q101_N$, $Q102_N$ constituting the current switch controller 100 is used as a digital switch, the setting of the dimensions of the collector area does not influence the operation of the variable attenuator at all.

Even when the current switch controller 100 is constituted by using MOS transistors, it is desirable to reduce the dimensions of the MOS transistors for the same reason.

Figure 9:
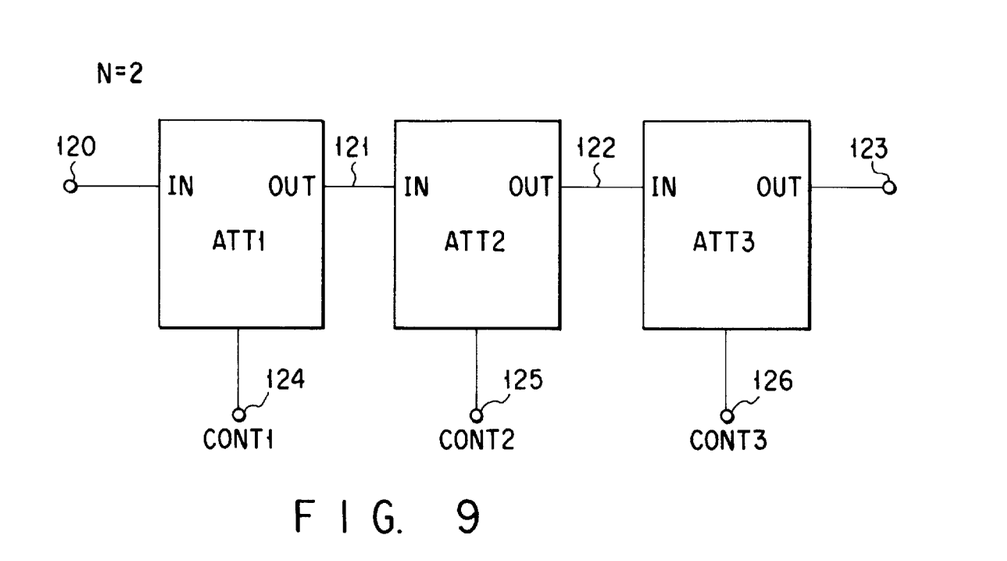
FIG. 9 is a block diagram of a multi-stage variable attenuator comprising a plurality of mutually connected variable attenuators according to the first embodiment of the invention.

FIG. 9 shows a modification of the variable attenuator according to the first embodiment shown in FIG. 1, wherein a plurality of stages of variable attenuators are cascade-connected. For the purpose of simple description, it is assumed that the variable attenuator of one stage comprises two amplifiers, i.e. #1 and #2 amplifiers shown in FIG. 1.

In FIG. 9, each of control signals CONT1, CONT2 and CONT 3 is used to select one of the #1 and #2 amplifiers of an associated one of variable attenuators ATT1, ATT2 and ATT3. An input signal to be gain-controlled is input to an input terminal 120 of the first-stage attenuator ATT1. The input signal is gain-controlled in the attenuator ATT1 by an amount set by the control signal CONT1 and the gain-controlled signal is output from an output terminal 121. The output terminal 121 serves as an input terminal of the second-stage variable attenuator ATT2. The signal input to the variable attenuator ATT2 is attenuated by an amount set by the control signal CONT2. The attenuated signal is input to the final-stage variable attenuator ATT3. The attenuator ATT3 attenuates the input signal by an amount set by the control signal CONT3. The attenuated signal is at last output from an output terminal 123.

In this circuit, for example, a gain of 0 dB or −4 dB is obtained by selecting one of the #1 amplifier or #2 amplifier in the variable attenuator ATT1. Similarly, a gain of 0 dB or −8 dB is obtained by selecting one of the #1 amplifier or #2 amplifier in the variable attenuator ATT2. A gain of 0 dB or −16 dB is obtained by selecting one of the #1 amplifier or #2 amplifier in the variable attenuator ATT3. Thus, by combining the gain control signals CONT1, CONT2 and CONT 3, the amount of attenuation can be set in four dB steps between 0 dB and −28 dB.

Figure 10:
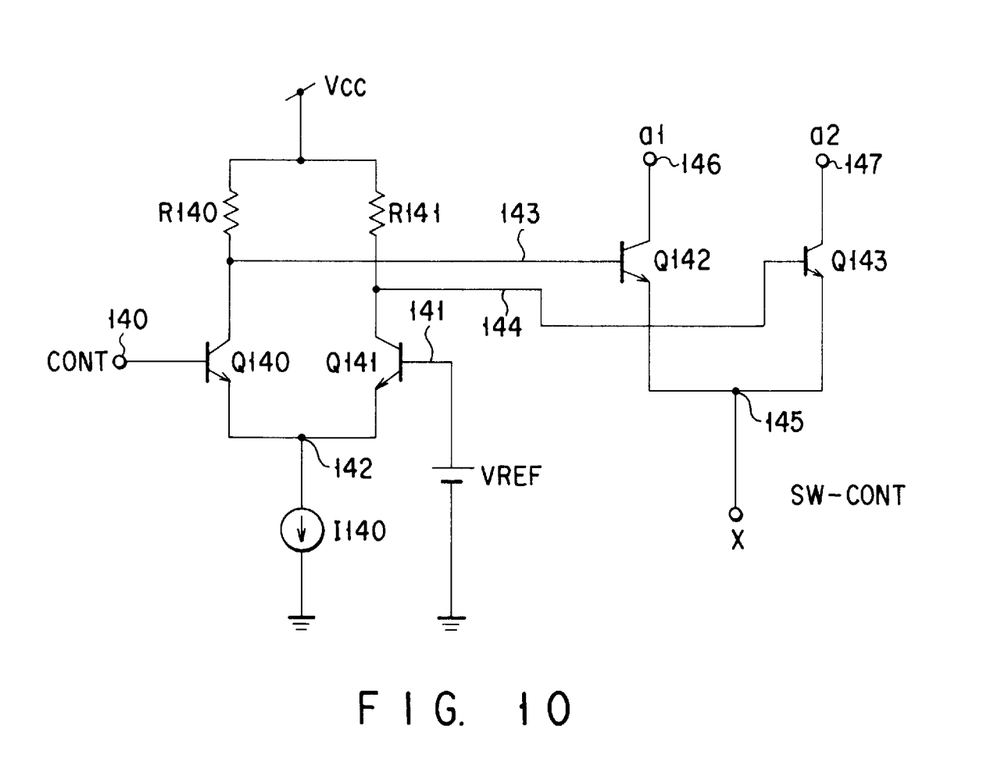
FIG. 10 is a circuit diagram of a current switch control circuit used in the multi-stage variable attenuator shown in FIG. 9.

FIG. 10 shows an example of a current switch controller used in FIG. 9.

This current switch controller is provided in each of the variable attenuators ATT1, ATT2 and ATT3 shown in FIG. 9. A current source connected to a terminal X is connected to one of terminals a1 and a2 in accordance with the gain control signal CONT input to the associated variable attenuator. In the structure shown in FIG. 10, one of the #1 amplifier and #2 amplifier provided in each of the variable attenuators is selected by a 1-bit gain control signal CONT.

Specifically, transistors Q140 and Q141 constitute a differential transistor pair and their common emitter terminal is grounded via a current source I140. Collector terminals of the transistors Q140 and Q141 are connected to a power supply VCC via resistors R140 and R141 and also connected to base terminals of transistors Q142 and Q143. The control signal CONT is input to the base terminal of the transistor Q140. The control signal CONT is a digital signal having an input level of, e.g. either potential VCC or GND. A base terminal of the transistor Q141 is connected to a reference voltage supply VREF set at a potential of, e.g. (VCC-GND)/2.

The transistors Q142 and 143 constitute a differential transistor pair and have a common emitter terminal 145. The terminal 145 corresponds to the terminal 5 in FIG. 1. Collector terminals 146 and 147 of the transistors Q142 and Q143 are output terminals of current I input from the common emitter terminal 145. The collector terminals 146 and 147 correspond to the terminals $3_1$ and $3_2$ in FIG. 1. In order to perform a perfect current switching operation by the differential pair of transistors Q142 and Q143, it is necessary to construct the circuit so as to meet the condition, I·R>75 mV, wherein R is the resistance value of each of resistors R140 and R141 and I is the current value of current source I140. By constructing the current switch circuit, as described above, the current switch controller can be easily fabricated.

Figure 11:
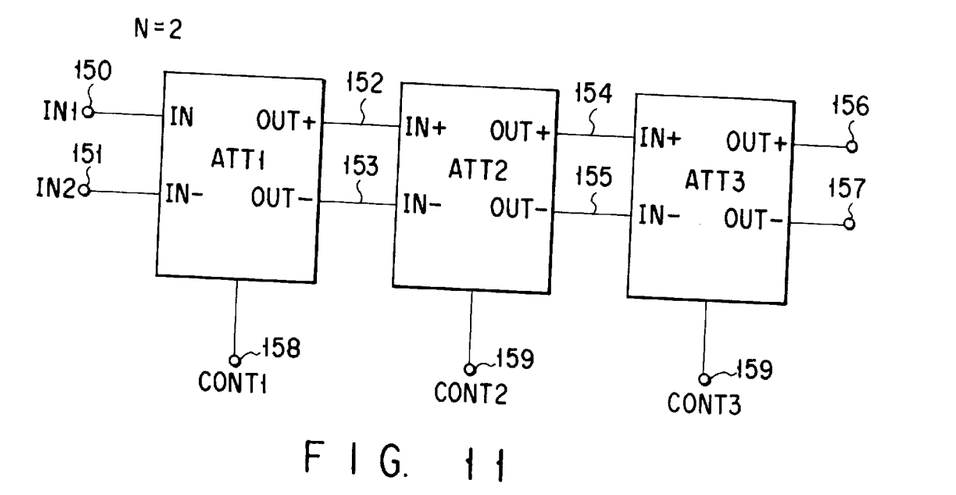
FIG. 11 is a block diagram of a multi-stage variable attenuator comprising a plurality of mutually connected variable attenuators according to the second embodiment of the invention.

FIG. 11 shows a modification of the differential type variable attenuator according to the second embodiment shown in FIG. 4, wherein a plurality of stages of differential type variable attenuators are cascade-connected. For the purpose of simple description, it is assumed that the differential type variable attenuator of one stage comprises two differential amplifiers, i.e. #1 and #2 differential amplifiers shown in FIG. 4.

In FIG. 11, each of control signals CONT1, CONT2 and CONT 3 is used to select one of the #1 and #2 differential amplifiers of an associated one of differential type variable attenuators ATT1, ATT2 and ATT3. Input signals IN1 and IN2 to be gain-controlled are input to differential input terminals 150 and 151 of the first-stage differential type variable attenuator ATT1. The input signals are gain-controlled in the attenuator ATT1 by an amount set by the control signal CONT1 and the gain-controlled signals are output from differential output terminals 152 and 153. The output terminals 152 and 153 serve as differential input terminals of the second-stage differential type variable attenuator ATT2. The signal inputs to the variable attenuator ATT2 are attenuated by an amount set by the control signal CONT2. The attenuated signals are input to the final-stage differential type variable attenuator ATT3. The attenuator ATT3 attenuates the input signals by an amount set by the control signal CONT3. The attenuated signals are at last output from differential output terminals 156 and 157.

In this circuit, for example, a gain of 0 dB or −4 dB is obtained by selecting one of the #1 amplifier or #2 amplifier in the variable attenuator ATT1. Similarly, a gain of 0 dB or −8 dB is obtained by selecting one of the #1 amplifier or #2 amplifier in the variable attenuator ATT2. A gain of 0 dB or −16 dB is obtained by selecting one of the #1 amplifier or #2 amplifier in the variable attenuator ATT3. Thus, by combining the gain control signals CONT1, CONT2 and CONT 3, the amount of attenuation can be set in four dB steps between 0 dB and −28 dB.

In general, an emitter follower circuit or a source follower circuit is provided as a buffer circuit between the variable attenuators ATT1 and ATT2 or between the variable attenuators ATT2 and ATT3. In the present embodiment, neither the emitter follower circuit nor source follower circuit is provided. The output of the variable attenuator ATT1 is directly connected to the input of the variable attenuator ATT2, and the output of the variable attenuator ATT2 is directly connected to the input of the variable attenuator ATT3. This is one of the important features of the present invention.

In the case where a current flowing in each variable attenuator ATT is set to be constant, a current flowing in the differential paired transistors of the variable attenuator ATT connected to the emitter follower circuit or source follower circuit becomes smaller than a predetermined value by an amount corresponding to a current flowing in the emitter follower circuit or source follower circuit. Consequently, linearity of input/output characteristics of the differential amplifier circuit is degraded (that is, a dynamic range is narrowed). This applies to not only the structure shown in FIG. 11 but also to the structure shown in FIG. 9.

Figure 12:
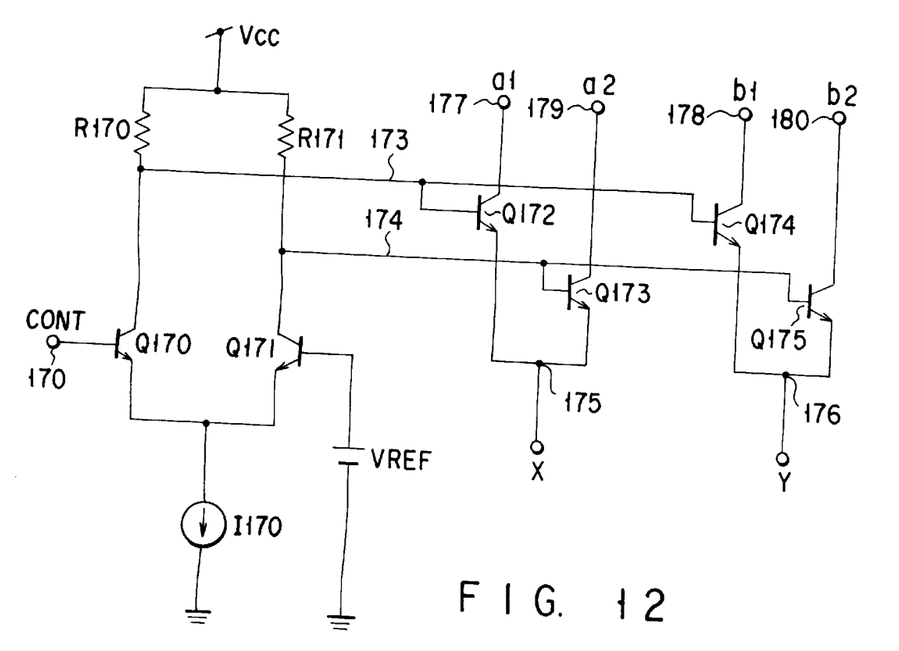
FIG. 12 is a circuit diagram of a current switch control circuit used in the multi-stage variable attenuator shown in FIG. 11.

FIG. 12 shows an example of a current switch controller used in FIG. 11.

This current switch controller is provided in each of the variable attenuators ATT1, ATT2 and ATT3 shown in FIG. 9. Two current sources connected to terminals X and Y are connected to paired terminals a1 and b1 or a2 and b2 in accordance with the gain control signal CONT input to the associated variable attenuator. In the structure shown in FIG. 12, one of the #1 amplifier and #2 amplifier provided in each stage of the variable attenuators is selected by a 1-bit gain control signal CONT.

Specifically, transistors Q170 and Q171 constitute a differential transistor pair and their common emitter terminal is grounded via a current source I170. Collector terminals of the transistors Q170 and Q171 are connected to a power supply VCC via resistors R170 and R171 and also connected to base terminals of transistors Q172 and Q173 as well as to base terminals of transistors Q174 and Q175. The control signal CONT is input to the base terminal of the transistor Q170. The control signal CONT is a digital signal having an input level of, e.g. either potential VCC or GND. A base terminal of the transistor Q171 is connected to a reference voltage supply VREF set at a potential of, e.g. (VCC-GND)/2.

The transistors Q172 and 173 constitute a differential transistor pair and have a common emitter terminal 175. The terminal 175 corresponds to the terminal 53 in FIG. 4. The transistors Q174 and 175 also constitute a differential transistor pair and have a common emitter terminal 176. The terminal 176 corresponds to the terminal 54 in FIG. 4. Collector terminals 177 and 178 of the transistors Q172 and Q174 are output terminals of currents I input from the common emitter terminals 175 and 176. The collector terminals 177 and 178 correspond to the terminals $55_1$ and $56_1$ in FIG. 4. Similarly, collector terminals 179 and 180 of the transistors Q173 and Q175 are output terminals of currents I input from the common emitter terminals 175 and 176. The collector terminals 179 and 180 correspond to the terminals $55_2$ and $56_2$ in FIG. 4.

In order to perform perfect current switching operations by the differential pair of transistors Q172 and Q173 and the differential pair of transistors Q174 and Q175, it is necessary to construct the circuit so as to meet the condition, I·R>75 mV, wherein R is the resistance value of each of resistors R170 and R171 and I is the current value of current source I170. By constructing the current switch circuit, as described above, the current switch controller can be easily fabricated.

Although the above description has been directed to the case of using bipolar transistors, the same operation of the circuit can be achieved by using MOS transistors. In the switch control circuit using the bipolar transistors, the current value of the current source has been described as being 75 mV or above for perfect current switching operations.

However, this value may be determined by the number of parallel-connected MOS transistors.

According to the structure of the present invention, the gain can be varied precisely in multiple stages. Thus, this structure is particularly effective in reducing transmission power of mobile radio devices. This invention, however, is applicable to all devices requiring high-precision variable gains.

As has been described above, this invention provides a variable attenuator capable of performing gain control in a digital manner, and not in an analog manner, with high precision at low cost.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A variable attenuator comprising:
   an input terminal to which an input signal is input;
   an output terminal connected to a load;
   a plurality of amplifiers having different gains, respectively, and connected commnonly to the load and the input terminal, each of the plurality of amplifiers include a corresponding impedance circuit for providing a corresponding one of the different gains,
   a current source; and
   a current switch circuit, connected between the current source and the plurality of amplifiers, for selecting one of the plurality of amplifiers in accordance with a control signal and supplying a current from the current source to the selected one of the plurality of amplifiers as an operating current.

2. The variable attenuator according to claim 1, wherein said each of the plurality of amplifiers, connected to said corresponding impedance circuit, comprises one of a common emitter amplifier circuit having a bipolar transistor and a common source amplifier circuit having a MOS transistor.

3. The variable attenuator according to claim 2, wherein the corresponding impedance circuit comprises a series circuit of a resistor and a capacitor.

4. The variable attenuator according to claim 1, wherein said each of the plurality of amplifiers comprises one of an emitter coupled differential amplifier circuit including a pair of bipolar transistors having a respective emitter coupled to each other through the corresponding impedance circuit and a source coupled differential amplifier circuit including a pair of MOS transistors having a respective source coupled to each other through the corresponding impedance circuit.

5. The variable attenuator according to claim 4, wherein the corresponding impedence circuit comprises one of a series circuit of a resistor and a capacitor or a parallel circuit of said resistor and said capacitor.

6. The variable attenuator according to claim 1, wherein the current switch includes a plurality of switching transistors each having a first terminal connected to the current source and a second terminal connected to a corresponding one of the plurality of amplifiers, and a control terminal to which the control signal is input for selecting one of the plurality of switching transistors, thereby causing the current from the current source to flow through the selected one of the plurality of switching transistors to the corresponding one of the plurality of amplifiers which is connected to the selected one of the plurality of switching transistors.

7. The variable attenuator according to claim 6, wherein the current source comprises a plurality of transistors connected in parallel, and the plurality of switching transistors are smaller in number than the plurality of transistors.

8. The variable attenuator according to claim 1, wherein the current source comprises a current mirror.

9. A variable attenuator comprising:
   an input terminal to which an input signal is input;
   an output terminal connected to a load;
   a plurality of differential amplifiers having different gains, respectively, each of the plurality of differential amplifiers comprising a pair of transistors connected commonly to the load and a corresponding impedance circuit connected to the pair of transistors for providing a corresponding one of the different gains;
   a pair of current sources; and
   a current switch circuit, coupled between the pair of current sources and the plurality of differential amplifiers, for selecting one of the plurality of differential amplifiers in accordance with a control signal and connecting the pair of current sources to the pair of transistors of the selected one of the differential amplifiers.

10. The variable attenuator according to claim 9, wherein said each of the plurality of differential amplifiers comprises one of an emitter coupled differential amplifier circuit including a pair of bipolar transistors and a source coupled differential amplifier circuit including a pair of MOS transistors, wherein the corresponding impedance circuit is connected between corresponding emitters of the bipolar transistors of the emitter coupled differential amplifier circuit an between corresponding sources of the MOS transistors of the source coupled differential amplifier circuit.

11. The variable attenuator according to claim 9, wherein each of the current sources comprises a current mirror.

12. A variable attenuator comprising a plurality of cascade-connected variable attenuator circuits, each variable attenuator circuit comprising:
   an input terminal to which an input signal is input;
   an output terminal connected to a load;
   a plurality of amplifiers having different gains, respectively, and connected commnonly to the load and the input terminal, each of the plurality of amplifiers including a corresponding impedance circuit for providing a corresponding one of the different gains;
   a current source; and
   a current switch circuit, connected between the current source and the plurality of amplifiers, for selecting one of the plurality of amplifiers in accordance with a gain control signal and supplying a current from the current source to the selected one of the plurality of amplifiers as an operating current,
   wherein the output terminal of a variable attenuator circuit located in a previous stage is directly connected to the input terminal of a variable attenuator circuit located in a subsequent stage, and a variable attenuator which includes the selected one of the plurality of amplifiers provides an overall gain for the input signal in accordance with the gain control signal.

13. A variable attenuator comprising a plurality of cascade-connected variable attenuator circuits, each variable attenuator circuit comprising:

an input terminal to which an input signal is input;

an output terminal connected to a load;

a plurality of differential amplifiers having different gains, respectively, each of the plurality of differential amplifiers comprising a pair of transistors connected commonly to the load and the input terminal, and including an impedance circuit for providing a corresponding one of the different gains;

a pair of current sources; and a current switch circuit, coupled between the pair of current sources and the plurality of differential amplifiers, for selecting one of the plurality of differential amplifiers in accordance with a control signal and connecting the pair of current sources to the pair of transistors of the selected one of the plurality of differential amplifiers, wherein the output terminal of a variable attenuator circuit located in a previous stage is directly connected to the input terminal of a variable attenuator circuit located in a subsequent stage, and a variable attenuator which includes the selected one of the plurality of differential amplifiers provides an overall gain for the input signal in accordance with the control signal.

* * * * *